(12) United States Patent
Lowther et al.

(10) Patent No.: US 7,110,933 B2
(45) Date of Patent: Sep. 19, 2006

(54) LINE MODELING TOOL

(75) Inventors: Rex E. Lowther, Palm Bay, FL (US);
Gregg D. Croft, Palm Bay, FL (US);
Yiqun Lin, Melbourne, FL (US);
Robert Lomenic, Palm Bay, FL (US);
James P. Furino, Jr., Melbourne, FL (US); Joseph A. Czagas, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 589 days.

(21) Appl. No.: 10/628,195

(22) Filed: Jul. 28, 2003

(65) Prior Publication Data

US 2005/0027502 A1    Feb. 3, 2005

(51) Int. Cl.
*G06F 17/50*    (2006.01)
(52) U.S. Cl. ........................................... 703/14
(58) Field of Classification Search .................. 703/14, 703/13; 716/4; 257/E23.144; 307/42; 333/260
See application file for complete search history.

(56) References Cited

U.S. PATENT DOCUMENTS 4,703,482 A * 10/1987 Auger et al. .................. 714/28
5,081,602 A * 1/1992 Glover ......................... 703/13
5,949,991 A * 9/1999 LeBlanc ....................... 703/14
6,167,364 A * 12/2000 Stellenberg et al. .......... 703/19
6,353,801 B1 * 3/2002 Sercu et al. ................... 702/65
6,915,500 B1 * 7/2005 Teig et al. ..................... 716/14

* cited by examiner

Primary Examiner—Albert W. Paladini
(74) Attorney, Agent, or Firm—Fogg and Associates LLC; Scott V. Lundberg

(57) ABSTRACT

A method of a modeling metallization parasitics with the use of a simulation program. In one embodiment, a method of simulating interconnect lines in an electronic design automation simulation is disclosed. The method comprises partitioning the interconnect lines into groups of interconnect lines. Each group of interconnect lines does not have interactions with any of the other groups of interconnect lines. Moreover, at least one of the groups of interconnect lines contains at least three interconnect lines. The interconnect lines in each group are modeled. The modeling includes at least one of modeling mutual inductances and modeling of mutual capacitances.

47 Claims, 5 Drawing Sheets

| CDF PARAMETER | VALUE |
|---|---|
| SHOW OUTPUT? | ■ |
| DC BYPASS LADDER | ■ |
| MODEL COMPLEXITY | UNCOUPLED YZ |
| DISTRIBUTION | Y COUPLING ON P NODE |
| PADDLE NODE | GND! |
| SET FREQUENCIES | 5.0e9 |
| ACCOUNT FOR CHIP EDGES? | ☐ |
| SIMULATE LINE 00? | ■ |
| LINE TYPE | DIFFERENTIAL LINE |
| METAL LEVEL | MET4 |
| WHAT'S BELOW | SHALLOW TRENCH |
| FREQUENCY | 5.0e9 |
| WIDTH (um) | 5.0 |
| P COORDINATE (um) | 00.0, 0.0 |
| M COORDINATE (um) | 00.0, 100.0 |
| GET COORDINATES FROM CURRENT LAYOUT | |
| RS | 1.974e-01 |
| INDUCTANCE | 7.039e-11 |
| CMS | 1.057e-14 |
| CPAD | 1.271e-14 |
| RPAD | 1.119e+03 |
| SIMULATE LINE 01? | ■ |
| LINE TYPE | SIGNAL LINE |

FIG. 3

LINE MODELING TOOL

TECHNICAL FIELD

The present invention relates generally to simulation computer programs and in particular the present invention relates modeling metallization parasitics in an integrated circuit.

BACKGROUND

Fully automated simulation computer programs have been quite successful at modeling on-chip interconnect in digital circuits. RF circuits, however, provide an extra set of challenges that make full automation difficult and impractical. The need for accurate inductance modeling and coupled substrate modeling are two of the difficulties. Furthermore, a more detailed knowledge of the circuit (such as which lines compose a differential pair) is often required. Rather than start from a nearly finished layout, the problem definition, in this invention, starts and ends with the user. Lower level functionality is then provided to minimize the tedium, to make experimentation of the model parameters and layout easier, and to help the user best understand the effect of each line and each parasitic on the circuit. As important, an equivalent compact model is provided without excessive generation time and without severely increasing the circuit simulation time.

As stated above, fully automated computer programs have been quite successful at simulating on-chip interconnect in digital circuits. In a typical scenario, the substrate is doped highly enough that the Silicon surface can be approximated as a conductive plane at the ground potential, and interconnect inductance does not need to be modeled (Although, this approximation becomes less accurate as digital circuits approach RF speeds). This leaves only inter-line and line-substrate capacitance to be modeled. Due to shielding, only short-range capacitive interactions need to be considered; and this makes it easy to partition a complicated layout with many lines into a larger number of smaller groups of lines for simulation.

In modeling inductance, however, it is not a good approximation to assume that distant lines are shielded by currents in metallization between these lines. Even worse, by neglecting mutual inductances smaller than some arbitrary cutoff, it is easy to run into situations where the combined model of the remaining inductances correspond to situations where energy conservation is violated (or to cases such that an effective subcircuit exists with negative inductance). To be safe, a fully-automated program is almost forced to avoid this scenario by adding the full inductance matrix to the circuit simulation. This is possible, but this normally makes the circuit simulations prohibitively slow.

Similarly, substrate coupling is also difficult to partition due to long-range interactions which have a typical length scale on the order of the wafer thickness (since the die-attach acts a ground plane). Since nearby lines (closer than the wafer thickness) "compete for fringing space," modeling each line separately for its admittance to the die attach would severely overestimate the admittance. The presence of each line alters the substrate interactions between the remaining lines. So, again, it is difficult to make the problem small in an automatic way. Unlike inductances, admittances smaller than an arbitrary cutoff can be safely omitted from the circuit simulation. However, since a matrix inversion is necessary to obtain the substrate coupling, the model generation step becomes prohibitively slow when the matrix becomes too large.

For the reasons stated above and for other reasons stated below which will become apparent to those skilled in the art upon reading and understanding the present specification, there is a need in the art for a relatively accurate and efficient computer simulation line modeling tool.

SUMMARY

The above-mentioned problems with computer simulation programs and other problems are addressed by the present invention and will be understood by reading and studying the following specification.

In one embodiment, a method of simulating interconnect lines in an electronic design automation simulation is disclosed. The method comprises partitioning the interconnect lines into groups of interconnect lines. Each group of interconnect lines does not have interactions with any of the other groups of interconnect lines. Moreover, at least one of the groups of interconnect lines contains at least three interconnect lines. The interconnect lines in each group are modeled. The modeling includes at least one of modeling mutual inductances and modeling of mutual capacitances.

In another embodiment, another method of modeling an integrated circuit with a simulation program is disclosed. The method comprises defining devices in the integrated circuit. Defining interconnect lines that electrically connect the devices. Grouping two or more interconnect lines into a plurality of separate linegroups, wherein at least one of the linegroups of interconnect lines contains at least three interconnect lines. Assigning a unique identification tag to each linegroup automatically for model generation and simulation identification upon the creation of the linegroup and modeling the interconnect lines in each linegroup to determine the electromagnetic behavior of each of the linegroups. Moreover, the modeling occurs without a linegroup affecting the modeling of another of the linegroups.

In yet another embodiment, a computer-readable medium including instructions for simulating interconnect lines in an integrated circuit is disclosed. The computer-readable medium comprises partitioning the interconnect lines into groups of interconnect lines. Each group of interconnect lines does not have interactions with any of the other groups of interconnect lines. Moreover, at least one group of the interconnect lines contains at least three interconnect lines and further wherein each group of interconnect lines is represented by a symbol in a schematic diagram. The interconnect lines in each group are modeled, wherein the modeling includes at least one of modeling mutual inductances and modeling of line to line capacitances.

BRIEF DESCRIPTION OF THE DRAWINGS

The present invention can be more easily understood and further advantages and uses thereof more readily apparent, when considered in view of the description of the preferred embodiments and the following figures in which:

FIG. 3 is a Component Description Format Window (CDF) of one embodiment of the present invention;

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the claims and equivalents thereof.

In regard to the present invention, it was decided early on that it is simply too difficult to equip the interconnect simulation tool with enough artificial intelligence to reliably simulate inductive and substrate coupling without prohibitively slowing down both the model generation and the circuit simulation. Instead, the approach draws from the intelligence of the circuit designer to partition the interconnect lines into noninteracting groups where the interactions within each group are fully modeled. The RF circuits that have been modeled have lent themselves to this type of "biopartitioning" such that the neglect of interactions between line groups results in a very reasonable approximation. The disadvantage of this approach is that the initial problem definition, particularly entering the coordinates of each line, can be time-consuming. However, with total control in the hands of the user, there are additional advantages in model flexibility, robustness and intuitiveness that would be difficult with a fully-automated approach.

Figure 1:
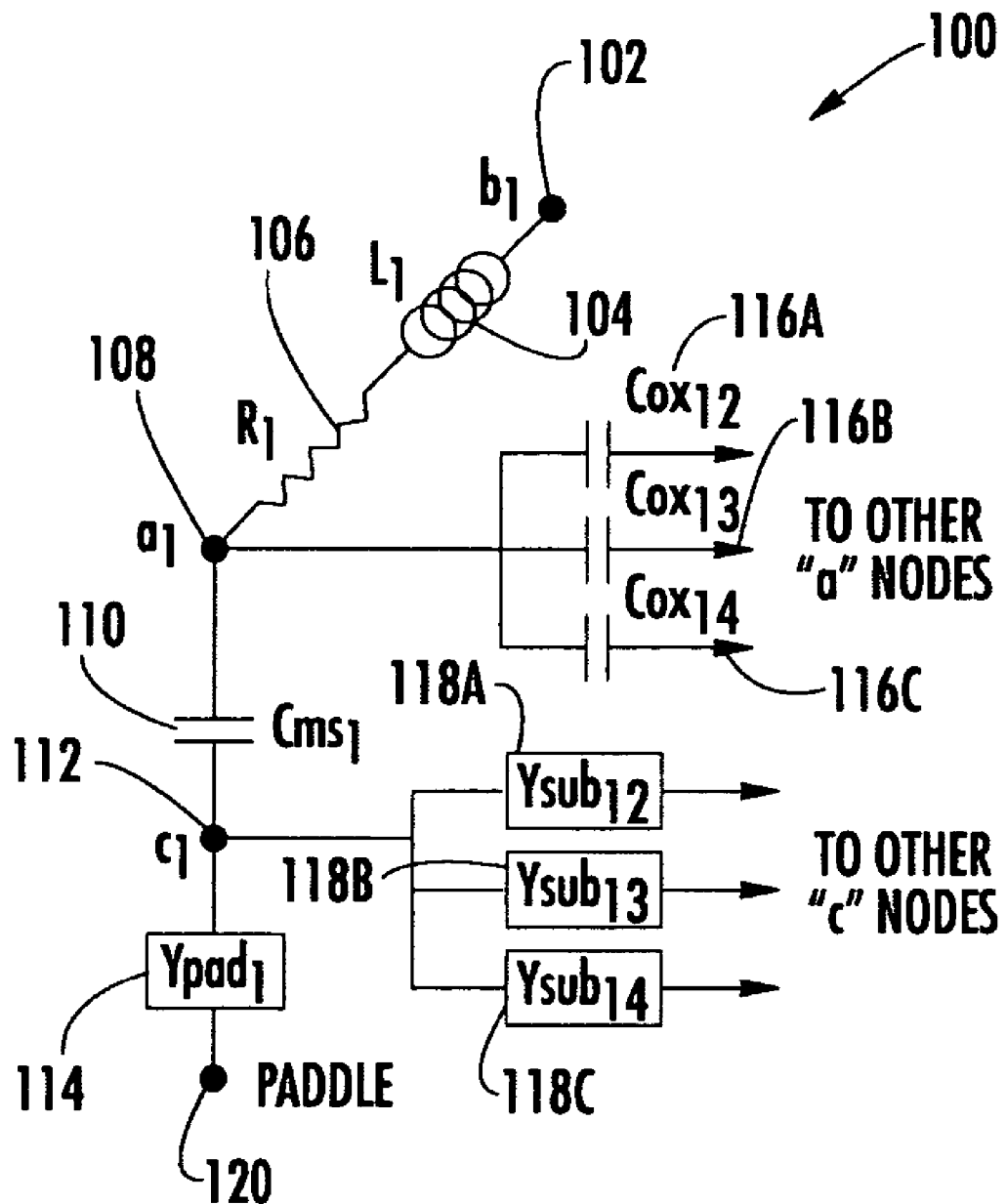
FIG. 1 is diagram of a model of one embodiment of the present invention.

One embodiment of a model 100 is depicted in FIG. 1. In particular the embodiment of FIG. 1 is an interconnect lumped-element model 100 having 1 line in a 4-line system. Mutual inductances between each line pair, not shown, are implied. The series impedance can be in a single lump as shown here, but by default, it is divided into two sections with a single coupling node 108 (the "a" node 108) between the sections. (Also not shown in FIG. 1 is a simple ladder topology for the series impedance used to get the correct resistance at both DC and the specified AC frequency.) The resistances are determined from curve fits to numerical simulations spanning the space of thickness, drawn width and frequency. The inductance matrix is constructed from standard formulae known in the art. For the special case of differentially paired lines, a separate curve fit for the resistance was necessary, and a dependence on the line spacing was added to the fit. Corrections to the inductance formula were also necessary to account for current crowding toward the interior between the differential line pairs.

The Metal-to-Substrate capacitances 110 (Cms) and the oxide capacitances (Cox) 116(A–C) between parallel lines (line to line capacitance) were determined from curve fits to a 2-D Poisson equation solver. Contributions to Cox 116 (A–C) from crossing lines were determined by a simple parallel-plate based formula accounting for fringing. The substrate coupling, Ypad 114 and Ysub 118(A–C), is determined using a Green's function method as described in the art. Each admittance, Y 114 and 118(A–C), represents both a capacitance and resistance in parallel. Conduction through the doped surface layers and through the substrate are both included. This calculation inverts a full matrix whose size depends heavily on the layout and the number of lines modeled. In this approach, where 20 lines or fewer are included in a group, the matrix size is almost always smaller than 200 by 200—corresponding to less than a second on a computer running at 900 Mhz. For all lines in a single layout without partitioning, this number would easily grow to larger than 3,000 equations—corresponding to 1 hour or more to solve. Although the above example uses 20 lines or fewer, it will be understood in the art that more than 20 lines could be used. In fact, the number of lines in a group is generally only restricted by the complexity of the layout, how fast the computer is running the simulation and the like. Accordingly, the present invention is not limited to 20 lines or fewer.

In particular, referring to model 100 of FIG. 1, $Cox_{12}$ 116A represents the capacitance from line 1 to line 2 through a dielectric above the semiconductor substrate. Similarly, $Cox_{13}$ 116B and $Cox_{14}$ represent the capacitance between lines 1 and 3 and lines 1 and 4 respectfully. $Ypad_1$ 114 are the admittances in a region of the substrate surface associated with line 1 through the substrate to the paddle. $Ysub_{12}$ is the admittance from a region of the substrate surface associated with line 1 to that of line 2. Similarly, $Ysub_{13}$ 118B and $Ysub_{14}$ 118C is the admittance in a region of the substrate surface associated with line 1 and line 3 and with line 1 and line 4 respectively. $Cms_1$ 110 is the capacitance of the line 1 to the surface of the semiconductor substrate. $R_1$ 106 is the series resistance of line 1 and $L_1$ 104 is the series inductance of line 1.

Figure 2:
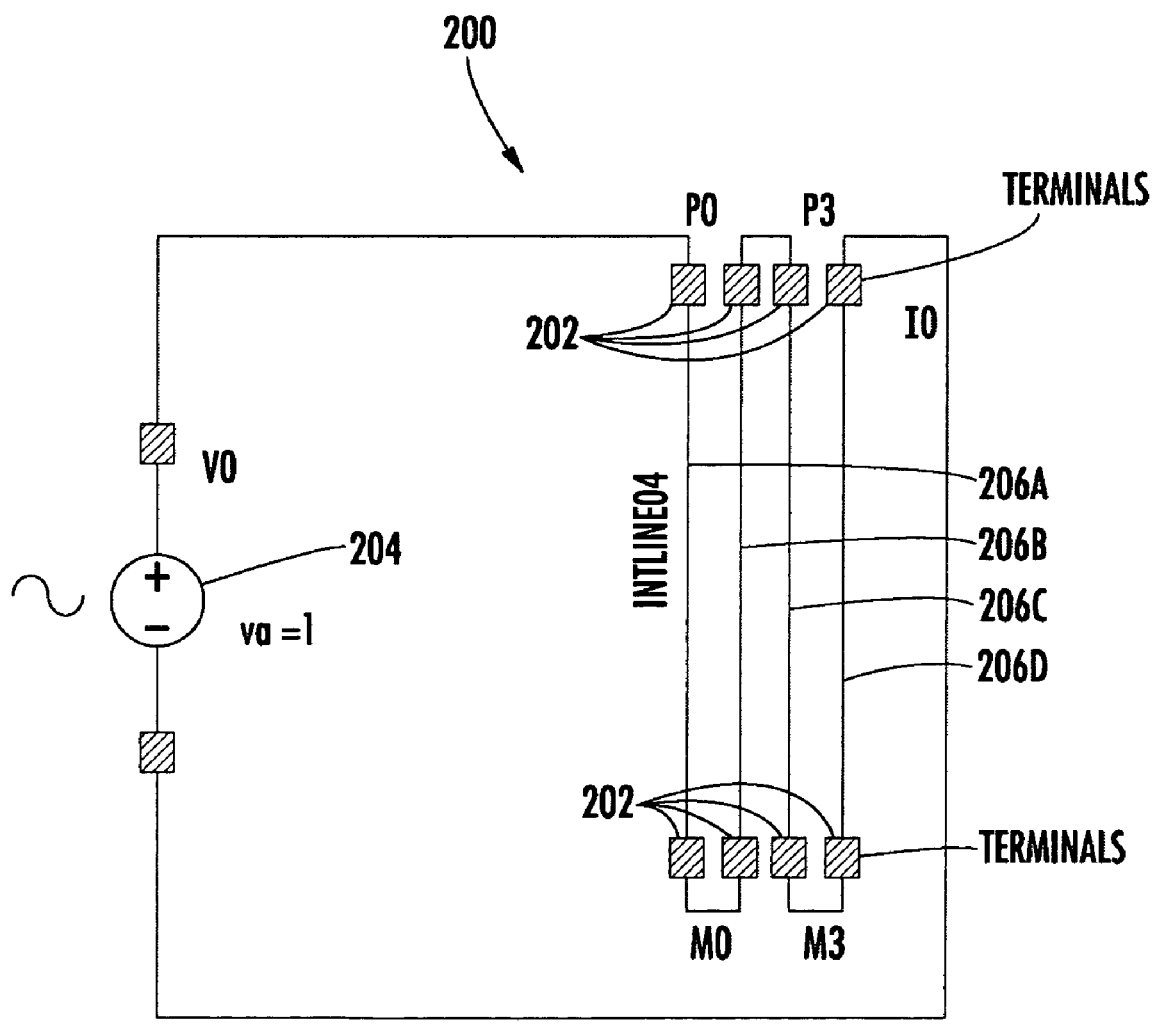
FIG. 2 is an illustration of symbol in one embodiment of the present invention.

In one embodiment, the model is incorporated into a circuit design system. Because the lines are partitioned into noninteracting groups, each group of lines (linegroup) can be treated as a separate device: Each linegroup includes a symbol 200 as illustrated in FIG. 2. The symbol 200 of this embodiment includes a plurality of interconnect lines 206A–206D and associated terminals 202. Also illustrated in FIG. 2 is a power supply 204 and ideal wires 212 that connect the simulated lines in the linegroup to each other and to the power supply 204. A Component Description Format window (CDF) which is used for user input, and a call-back which gets invoked each time the CDF is updated. During the call-back, the model is updated, and model information is also returned to the CDF.

Although FIG. 2 only illustrates four interconnect lines 206A–206D the number of interconnect lines can vary. Moreover, as illustrated in FIG. 2, in this embodiment, the number of terminals 202 is twice as many (2N) as the number of interconnect lines 206A–206D. For example in a similar embodiment, a group of 20 lines will have 40 terminals in the symbol, and an implicit terminal for the die-attach. However, in other embodiments, additional terminals may be specified. For example, the additional terminals may represent a paddle, ground or the like. Moreover, in another example, only one terminal is used when the interconnect line modeled is actually a bond pad or nonmetal region.

An example of one embodiment of a CDF 300 is illustrated in FIG. 3. In FIG. 3, only parameters for the first line (line 00) are shown. If line 00 is modeled, then the parameters for that line are also displayed. If the "Show Output" parameter is designated, then the self terms of the model for that line are displayed. The global parameters, not specific to a particular line, are at the top of the form. These can also be specified once in a separate form that controls all the linegroups in a circuit schematic. The "Model Complexity" defaults to the most complete ("Coupled YZ") which turns on full coupling between all lines in the group and calculates both the impedances ("Z" for series R and L) and admittances ("Y" for capacitive and substrate coupling, Cox, Ypad and Ysub). There are also options to simulate either various subsets, to turn off coupling between lines, or to turn off all parasitics by selecting "Model Complexity"="Wires." The "Paddle Node" parameter should represent the node at the paddle below these lines. By default, this is the ground node, but is usually reset to whatever the paddle node is in the simulation. The "Wafer Thickness" has an effect on the substrate coupling, inductances of long lines and on mutual inductances between widely spaced lines. The "Global Frequency" sets the frequency for the whole group of lines, but this can be overridden for individual lines as shown on the CDF. Most of the above global (to the linegroup) parameters, not specific to individual lines, can also be set in a separate form with global control over all linegroups in a schematic.

The parameters specific to line 00 are displayed between "Simulate line 00?" and "Simulate line 01?" The "Line Type" is typically set to "Signal Line" which just means that is a metal line. There are also options to make it half of a differential pair of lines, a "Substrate Tie" (a "Signal Line" with Cms replaced by a short), or a "Nonmetal Region" (a region with both terminals, one redundant, at the Silicon surface). The "What's Below" parameter tells the program just that. It defaults to the doping stack found in the process when no masks are specified. There are also options to account for other doped layers, trench grids (which prevent lateral conduction in doped layers), a doped patterned ground shield, or a Metal 1 patterned ground shield. The line dimensions are determined from the width and from the coordinate pairs at the two ends arbitrarily named "P" and "M." These two coordinate pairs determine a (mathematical) line running down the middle of the metal line from the "P" end to the "M" end. In one embodiment, there is an option to model an arrangement where at least one of the lines in a group of interconnect lines (a line group) is shielded by a patterned metal shield in a layer between said line and the semiconductor substrate. Further in another embodiment, at least one of the other lines in the group of interconnected lines is modeled as being directly coupled to the patterned shield.

There are some line-specific things any interconnect modeling program can't know unless you tell it. Not all lines necessarily run at the same frequency. For example, some circuits have subcircuits that make the output frequency half of the input frequency. Differential line pairs differ significantly from weakly-coupled lines in their frequency-dependences of series resistance and total inductance. To account for these departures from the norm, "automatic" interconnect simulators are forced, to some extent, to allow some user-intervention. Since these "automatic" codes weren't originally designed for this, adding this capability can conceivably reduce the utility of the automatic approach. There are also many devices where metallization is already part of the model, for example, in a spiral inductor. To prevent double counting of the metal parasitics, in this example, automatic codes are told not to model them.

There are also instances where automatic interconnect simulators make the problem much more difficult than necessary. Some small lines, and stretches of a trace short wrt. other stretches in the same trace can typically be ignored. Recognizing these cases becomes easy for the user with a little experience, but coding for this in a safe and general way is extremely difficult. Patterned ground shields are very useful. These are strips of metal, or of highly doped regions below, and aligned perpendicular to the signal line. This reduces loss and decouples the line from the substrate thereby improving isolation and reducing loss. A fully automated code would attempt to model each strip in the shield separately. In this model, the correct physics are easily emulated with a capacitance from each of the differential lines to the shield. From that point the shield couples through the remaining oxide and substrate. The effect of the patterning in the shield is to prevent eddy currents which are never calculated by the model anyway.

There is a tendency to treat interconnect as an afterthought; the layout is usually done after the initial design is completed. Yet, it is well known that the line inductance and capacitance can significantly change the tuning, for example, of a circuit-forcing a retuning of the regular circuit elements. Since fully automated interconnect simulators need a complete layout for simulation, they make it impossible to integrate circuit simulation with layout design. In embodiments of this invention, the line coordinates can be entered either by hand or from a layout at any stage of completeness. This "feature" does give some flexibility for integrated circuit/layout design at an earlier stage, and reduces redesign of the layouts.

Designers should be able to experiment with the line width and the various other options, and to quickly see the effect of these changes on their circuit. For example, the line width should often be determined by the trade-offs between series resistance and capacitive substrate loss. Similarly, there should be easy ways to simulate the various options of doping, trenching, and shielding below the lines without having to actually lay out each of these cases. In fact, these experiments are possible in this work by changing a single parameter in the CDF. Through experimentation with these parameters, the designer is able to build a better feel, or expertise, for the various line parasitics that will help future designs. To help with this, the "self" terms in the model are displayed immediately after each change in the CDF.

Figure 4:
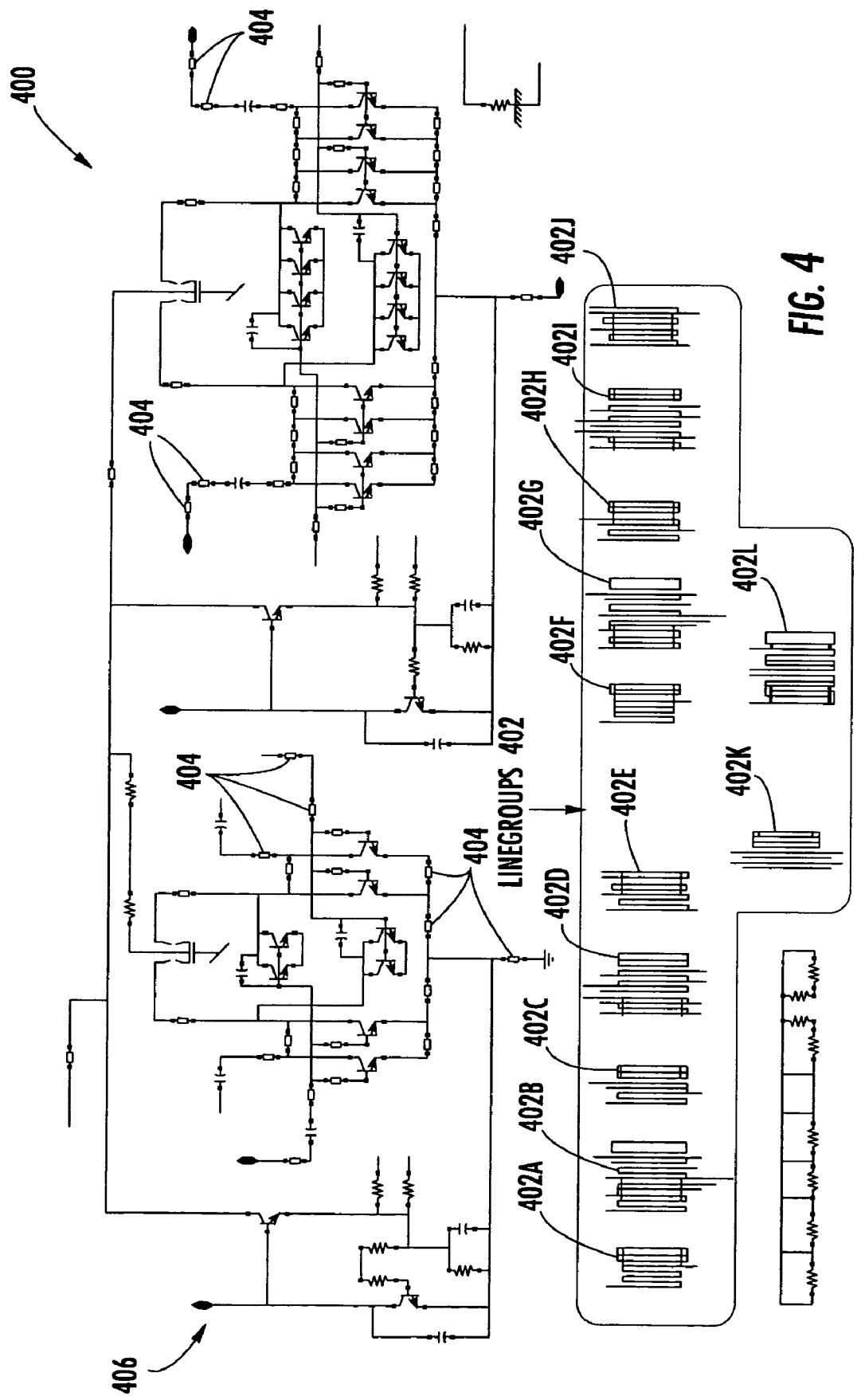
FIG. 4 is a schematic display of one embodiment of the present invention.

Referring to FIG. 4, an example of one embodiment of circuit schematic display 400 of the present invention is illustrated. As illustrated, symbols for a plurality of linegroups 402A–402L are shown. These linegroups 402A–402L are added to model the metal interconnects between different parts of the circuit 406. In this embodiment, each linegroup 402A–402L) (linegroup symbol) shows a number of vertical lines. This represents the number of metal lines that a particular linegroup can model. In the example of FIG. 4, some of the groups are modeling 8 lines of metal and some of the groups are modeling 12 lines of metal. Within each linegroup the mutual or coupling terms are also modeled. No mutual terms or interactions are modeled from one linegroup to another.

Place holders 404 are placed in circuit 406 to indicate where a particular piece of interconnect is modeled. Without placeholders 404, the wiring of many lines that have to connect to a linegroup symbol can often result in a tangled mess. Since the placeholder 404, in one embodiment, refers to only a single line, they can be placed along the normal path that the ideal wire would take without linegroup modeling. The placeholders 404 then refer to the correct node on the correct linegroup. This allows the user to move the linegroups out of the way of the rest of the schematic.

Referring back to FIG. 2, in one embodiment, the symbol for an interconnect line includes two terminals 202 that represent the ends of an associated interconnect line 206A–206D. Although, the embodiments disclosed herein illustrate the symbol for linegroups as a number of lines, other embodiments include other select symbols to represent linegroups. In addition, in one embodiment, the line coordinates are entered into the CDF from a layout window with the use of a mouse. In another embodiment, the line coordinates are entered from a keyboard.

Figure 5:
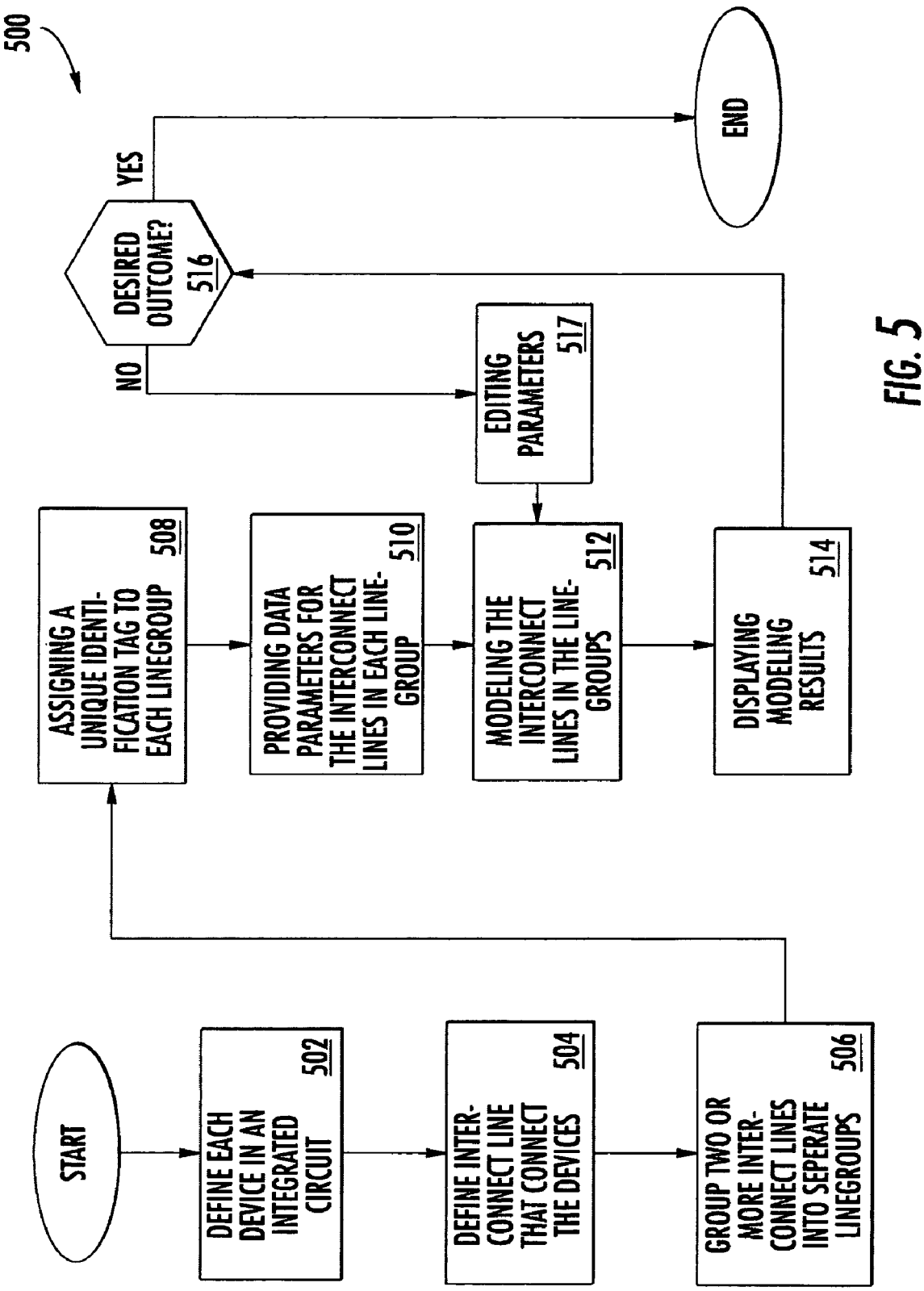
FIG. 5 is a flow chart illustrating a method of one embodiment of the present invention.

A flow chart 500 illustrating one method of implementing one embodiment of the present invention is illustrated in FIG. 5. As illustrated, the method starts by defining each device in an integrated circuit (502). The interconnect lines are defined (504). The interconnect lines are then portioned into a plurality of separate groups called linegroups (506). In one embodiment at least one linegroup comprises two or more interconnect lines. Further, in another embodiment, at least one of the linegroups comprises three or more interconnect lines. Each linegroup is automatically assigned a unique identification tag, for model generation and simulation identification, upon its creation (508). The user then provides data defining parameters for the interconnect lines in each linegroup. In one embodiment, the parameters are entered into a component description format window (510). The defining parameters may include the frequencies of each interconnect line in a linegroup, the layers that the lines are drawn in, and coordinates that define the location of linegroups and the interconnect lines in each linegroup. In one embodiment, a layout is displayed on a computer monitor. In this embodiment, the user simply marks a location on the layout to enter a linegroup coordinate. In a further embodiment, placeholders are then used in a schematic diagram to enhance the readability of the schematic.

The interconnect lines in each linegroup are then modeled (512). The modeling is at least in part based on the defining parameters. The results of the modeling are then displayed (514). The modeling includes electromagnetic behavior such as mutual inductances and capacitances between the interconnect lines in each linegroup. In one embodiment, the interactions between at least one of the line groups with another of the line groups is also modeled. An example of this embodiment is where two groups of lines groups are positioned adjacent each other. The interaction (mutual inductances and capacitances) between the closest lines in each of the adjacent line groups would be modeled. In this embodiment, the modeling between the closest lines in each of the adjacent line groups would be secondary to the modeling of the lines in each line group. The models are automatically identified and read into a circuit netlist for circuit simulation (515). If the results of the modeling are desired (516), the method is complete. However, if the results of modeling (512) are not desired, the user may edit the parameters (517) until the desired results are achieved as indicated in the flow chart 500 of FIG. 5. In one embodiment, the results of the modeling are displayed upon the entering of the data defining parameters so the user can obtained a desired model of the interconnect lines in a line group in a fast and efficient manner.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of simulating interconnect lines in an electronic design automation simulation, the method comprising:
   partitioning the interconnect lines into groups of interconnect lines, wherein each group of interconnect lines does not have interactions with any of the other groups of interconnect lines and wherein at least one of the groups of interconnect lines contains at least three interconnect lines; and
   modeling the interconnect lines in each group, wherein the modeling includes at least one of modeling mutual inductances and modeling of mutual capacitances.

2. The method of claim 1, further comprising:
   shielding at least one of the lines in a group of interconnect lines with a metal shield.

3. The method of claim 2, wherein the metal shield is a patterned metal shield.

4. The method of claim 2, further comprising;
   coupling at least one of the other lines in the group of interconnect lines to the metal shield.

5. The method of claim 1, wherein modeling the interconnect lines in each group further comprises:

providing data defining parameters of the interconnect lines in the group; and determining model data based at least in part on the data defining the parameters.

6. The method of claim 5, wherein providing the data defining the parameters of the interconnect lines in the group further comprises:

inputting the data defining parameters through a component description format window.

7. The method of claim 5, further comprising:

displaying the modeling results of the interconnect lines upon the entering of the data defining parameters, wherein the data defining parameters can be edited to achieve a desired model of the interconnect lines.

8. The method of claim 5, wherein defining parameters include the frequencies of each interconnect line in a group.

9. The method of claim 8, wherein the frequencies for each interconnect line is defined separately.

10. The method of claim 1, further comprising:

assigning a unique identification tag to each model group of interconnect lines.

11. The method of claim 10, wherein each unique identification tag is assigned automatically upon the creation of an associated model group of interconnect lines.

12. A method of modeling an integrated circuit with a simulation program, the method comprising:

defining devices in the integrated circuit;

defining interconnect lines that electrically connect the devices;

grouping three or more interconnect lines into a plurality of separate linegroups, wherein at least one of the linegroups of interconnect lines contains at least three interconnect lines;

assigning a unique identification tag to each linegroup automatically for model generation and simulation identification upon the creation of the linegroup; and modeling the interconnect lines in each linegroup to determine the electromagnetic behavior of each of the linegroups, wherein the modeling occurs without a linegroup affecting the modeling of another of the linegroups.

13. The method of claim 12, wherein the electromagnetic behavior includes interactions between the interconnect lines within each line group.

14. The method of claim 12, further comprising:

compiling the results of the modeling in a form that allows a circuit design system to simulate it.

15. The method of claim 14, wherein the form is a lumped-element description of each linegroup including at least one of mutual inductance between two lines in a line group and capacitance between two lines in the linegroup.

16. The method of claim 12, wherein modeling the interconnect lines in each linegroup further comprises:

providing data defining parameters of the interconnect lines in the linegroup; and determining model data based at least in part on the defining parameters.

17. The method of claim 16, wherein providing the data defining the parameters of the interconnect lines in the linegroups further comprises:

inputting the data defining parameters through a component description format window.

18. The method of claim 16, further comprising:

displaying modeling results of the interconnect lines in each linegroup upon the entering of the data defining parameters, wherein the data defining parameters can be edited to achieve a desired model of the interconnect lines in a linegroup.

19. The method of claim 18, wherein the defining parameters include independently settable frequencies for each interconnect line in a linegroup.

20. The method of claim 16, wherein the defining parameters include coordinates of a linegroup.

21. The method of claim 16, further comprising:

entering linegroup coordinates with a keyboard.

22. The method of claim 16, further comprising:

displaying a layout; and marking the layout to enter linegroup coordinates.

23. The method of claim 16, further comprising:

displaying a schematic diagram.

24. The method of claim 23, further comprising:

using placeholders in the schematic diagram to improve readability of the schematic.

25. The method of claim 23, wherein each linegroup is represented by a symbol in the schematic diagram.

26. The method of claim 25, wherein the symbol illustrates at least one terminal per associated interconnect line.

27. The method of claim 25, wherein the symbol illustrates 2 terminals that represent two ends of an interconnect line.

28. A computer-readable medium including instructions for simulating interconnect lines in an integrated circuit comprising:

partitioning the interconnect lines into groups of interconnect lines, wherein each group of interconnect lines does not have interactions with any of the other groups of interconnect lines and wherein at least one group of the interconnect lines contains at least three interconnect lines and further wherein each group of interconnect lines is represented by a symbol in a schematic diagram; and modeling the interconnect lines in each group, wherein the modeling includes at least one of modeling mutual inductances and modeling of line to line capacitances.

29. The computer-readable medium including instructions for simulating interconnect lines in an integrated circuit of claim 28, wherein modeling the interconnect lines in each group further comprises:

providing data defining parameters of the interconnect lines in the group; and determining model data based at least in part on the data defining the parameters.

30. The computer-readable medium including instructions for simulating interconnect lines in an integrated circuit of claim 29, wherein providing the data defining the parameters of the interconnect lines in the group further comprises:

inputting the data defining parameters into a component description format window.

31. The computer-readable medium including instructions for simulating interconnect lines in an integrated circuit of claim 29, further comprising:

displaying the modeling results of the interconnect lines upon the entering of the data defining parameters, wherein the data defining parameters can be edited to achieve a desired model of the interconnect lines.

32. The computer-readable medium including instructions for simulating interconnect lines in an integrated circuit of claim 29, wherein defining parameters include the frequencies of each interconnect line in a group.

33. The computer-readable medium including instructions for simulating interconnect lines in an integrated circuit of claim 32, wherein the frequencies for each interconnect line are defined separately.

34. The computer-readable medium including instructions for simulating interconnect lines in an integrated circuit of claim 28, further comprising:
assigning a unique identification tag to each model group of interconnect lines.

35. The computer-readable medium including instructions for simulating interconnect lines in an integrated circuit of claim 34, wherein each unique identification tag is assigned automatically upon the creation of an associated model group of interconnect lines.

36. The computer-readable medium including instructions for simulating interconnect lines in an integrated circuit of claim 28, further comprising:
identifying and reading interconnect line models automatically into circuit netlist for simulation.

37. A method of simulating interconnect lines in an electronic design automation simulation, the method comprising:
partitioning the interconnect lines into groups of interconnect lines, wherein at least one of each group of interconnect lines has a select interaction with another of one of the groups of interconnect lines and further wherein at least one of the groups of interconnect lines contains at least three interconnect lines; and
modeling of interconnect lines, wherein the modeling includes substantially more modeling of mutual inductances and mutual capacitances within each group of interconnect lines than modeling of mutual inductances and capacitances between groups of interconnect lines.

38. The method of claim 37, further comprising:
assigning a unique identification tag to each linegroup automatically for model generation and simulation identification upon the creation of the linegroup.

39. The method of claim 37, wherein modeling the interconnect lines in each group further comprises:
providing data defining parameters of the interconnect lines in the group; and
determining model data based at least in part on the data defining the parameters.

40. The method of claim 37, further comprising:
displaying the modeling results of the interconnect lines upon the entering of the data defining parameters, wherein the data defining parameters can be edited to achieve a desired model of the interconnect lines.

41. A method of manufacturing an integrated circuit, the method comprising:
simulating interconnect lines in an electronic design automation simulation, the simulation including:
partitioning the interconnect lines into groups of interconnect lines, wherein each group of interconnect lines does not have interactions with any of the other groups of interconnect lines and wherein at least one of the groups of interconnect lines contains at least three interconnect lines, and
modeling the interconnect lines in each group, wherein the modeling includes at least one of modeling mutual inductances and modeling of mutual capacitances; and forming the integrated circuit with use of the simulation of the interconnect lines.

42. The method of claim 41, wherein the integrated circuit is an RF circuit.

43. The method of claim 41, wherein not all of the interconnect lines run at the same frequency.

44. The method of claim 41, wherein to integrated circuit includes a patterned ground shield.

45. The method of claim 41, wherein the simulation further comprises:
defining each device in the integrated circuit.

46. A method of manufacturing an integrated circuit, the method comprising:
modeling an integrated circuit with a simulation program, the modeling including,
defining devices in to integrated circuit,
defining interconnect lines that electrically connect the devices,
grouping three or more interconnect lines into a plurality of separate linegroups,
wherein at least one of the linegroups of interconnect lines contains at least three interconnect lines,
assigning a unique identification tag to each linegroup automatically for model generation and simulation identification upon the creation of the linegroup, and
modeling the interconnect lines in each linegroup to determine the electromagnetic behavior of each of the linegroups, wherein the modeling occurs without a linegroup affecting the modeling of another of the linegroups; and
forming interconnect lines in the integrated circuit using the modeled interconnect lines.

47. A method of manufacturing an integrated circuit, the method comprising:
simulating interconnect lines in an electronic design automation simulation, the simulation including,
partitioning the interconnect lines into groups of interconnect lines, wherein at least one of each group of interconnect lines has a select interaction with another of one of the groups of interconnect lines and further wherein at least one of the groups of interconnect lines contains at least three interconnect lines, and
modeling of interconnect lines, wherein the modeling includes substantially more modeling of mutual inductances and mutual capacitances within each group of interconnect lines than modeling of mutual inductances and capacitances between groups of interconnect lines; and
forming the integrated circuit using the simulation of the interconnect lines.

* * * * *